US012710469B2

(12) United States Patent
Schwerdtfeger et al.

(10) Patent No.: US 12,710,469 B2
(45) Date of Patent: Aug. 18, 2026

(54) MODULAR POSITIONER AND/OR FIXTURE, MEASUREMENT SYSTEM AND DATA PROCESSING PROGRAM PRODUCT FOR A DEVICE UNDER TEST (DUT)

(71) Applicant: Rohde & Schwarz GmbH & Co. KG, Munich (DE)

(72) Inventors: Constantin Schwerdtfeger, Munich (DE); Stefan Schoetz, Kollnburg (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 313 days.

(21) Appl. No.: 18/430,826

(22) Filed: Feb. 2, 2024

(65) Prior Publication Data

US 2025/0251441 A1 Aug. 7, 2025

(51) Int. Cl.
*G01R 31/28* (2006.01)

(52) U.S. Cl.
CPC ..... *G01R 31/2844* (2013.01); *G01R 31/2837* (2013.01)

(58) Field of Classification Search
CPC ........................ G01R 31/2837; G01R 31/2844
See application file for complete search history.

(56) References Cited

U.S. PATENT DOCUMENTS 8,294,623 B2 10/2012 Okazaki
9,506,948 B2 * 11/2016 Yamada ............... G01R 1/0441
2010/0134364 A1 6/2010 Okazaki

FOREIGN PATENT DOCUMENTS

CN 211121996 U 7/2020
EP 2184612 A1 5/2010

* cited by examiner

*Primary Examiner* — Amy He
(74) *Attorney, Agent, or Firm* — Westman, Champlin & Koehler, P.A.

(57) ABSTRACT

The present disclosure relates to a modular positioner and/or fixture, a measurement system and a data processing program product for a device under test (DUT), comprising a first positioning and/or fixing connector, adapted for being detachably mounted to a DUT, a second positioning and/or fixing connector for mounting to a test arrangement, the first positioning and/or fixing connector and second positioning and/or fixing connector being adapted to automatically interact with each other to provide a positioning and/or fixing of a DUT by automatically effecting a positive form-fit interaction and/or for non-positive force-fit interaction, further comprising elongated guiding elements, adapted for guiding the first positioning and/or fixing connector into a fixing position with respect to the second positioning and/or fixing connector.

13 Claims, 9 Drawing Sheets

MODULAR POSITIONER AND/OR FIXTURE, MEASUREMENT SYSTEM AND DATA PROCESSING PROGRAM PRODUCT FOR A DEVICE UNDER TEST (DUT)

FIELD OF THE DISCLOSURE

The present disclosure relates to a positioner and/or fixture for a device under test (DUT), to a measurement system for a device under test (DUT) and to a data processing program product for use with an afore mentioned positioner and/or fixture for a device under test (DUT) and/or with an afore mentioned measurement system for a device under test (DUT).

BACKGROUND OF THE DISCLOSURE

A Device Under Test (DUT) may undergo various testing and measurement scenarios, particularly in the fields of electronics, telecommunications, and engineering. The technical concept of a DUT is the idea of subjecting such a device to specific conditions to evaluate its performance, characteristics, or functionality. This means that the primary purpose is that a DUT shall undergo testing or evaluation to ensure that it meets specified requirements, standards, or performance criteria. So, a reliable mounting, positioning and fixing and secure holding of a DUT is a crucial requirement to allow such afore mentioned evaluation of its performance, characteristics, or functionality.

Mounting, positioning and/or fixing a DUT may involve different technical principles to ensure accurate and reliable fixing, holding and as a result, accurate and reliable testing. The specific principles can vary depending on the type of device and the nature of the testing being conducted. Mechanical clamps and hold-downs may be used to secure the DUT in a fixed position. This method is common for larger devices or those with irregular shapes. Alternatively, custom-made fixtures may be specifically designed for a particular DUT. Such custom-made fixtures can incorporate a combination of clamps, probes, and other fixturing methods tailored to the DUT's size and shape.

PRIOR ART

Document EP 2184612 A1 describes an electromagnetic wave measuring apparatus which includes: a reception antenna receiving an electromagnetic wave generated from an electronic apparatus placed at a predetermined distance away; an antenna mast holding the reception antenna; and a base portion fixing an end of the antenna mast vertically to a floor.

Document CN 211121996 U describes a new energy electric assembly fast-assembling test board for new energy powertrain test. A silencer comprises a large base, a left sliding table, a right sliding table, a left anechoic chamber and a right anechoic chamber. The left anechoic chamber and the right anechoic chamber are located on the large base.

SUMMARY OF THE DISCLOSURE

Previously known positioners and/or fixtures for a device under test (DUT) and respective measurement systems for a device under test (DUT) usually require relatively complex manual positioning and/or fixing procedures. Consequently, mounting times and changeover times using known positioners and/or fixtures and respective measurement systems for a device under test are problematic, as well as and safe, secure, reliable and reproducible handling and testing.

Embodiments of the present disclosure advantageously and in particular address the foregoing requirements and needs, as well as others, by providing a new and improved positioner and/or fixture for a device under test (DUT), a new and improved measurement system for a device under test (DUT) and a respective new and improved data processing program product for use with an afore mentioned positioner and/or fixture for a device under test (DUT) and/or with an afore mentioned measurement system for a device under test (DUT).

Aspects of the disclosure is defined by the appended independent claims. Specific embodiments are set forth in the dependent claims and in the following description and drawings.

In accordance with the present disclosure, the following is provided:

- A modular positioner and/or fixture for a device under test (DUT), as recited in claim 1 or claim 2;
- a measurement system for a device under test (DUT) comprising a modular positioner and/or fixture, in particular comprising an afore mentioned modular positioner and/or fixture, as recited in claim 10; and
- a data processing program product, adapted for operating a measurement system for a device under test (DUT), in particular an afore mentioned measurement system for a device under test (DUT) and in particular in using an afore mentioned modular positioner and/or fixture, as recited in claim 13.

According to a first aspect, the present disclosure provides a modular positioner and/or fixture for a device under test (DUT), comprising a first positioning and/or fixing connector or a plurality of first positioning and/or fixing connectors adapted for being detachably mounted to a DUT, and comprising a second positioning and/or fixing connector or a plurality of second positioning and/or fixing connectors adapted for being mounted to a test arrangement, the or each first positioning and/or fixing connector being adapted to interact with a respective second positioning and/or fixing connector to provide a positioning and/or fixing of said DUT, thereby effecting a positive form-fit interaction and/or for non-positive force-fit interaction, and further comprising an elongated guiding element or a plurality of elongated guiding elements, in particular a guiding pin or a plurality of guiding pins, said guiding element or elements being adapted for guiding the first positioning and/or fixing connector into a fixing position with respect to the second positioning and/or fixing connector.

According to a second aspect, the present disclosure provides a modular positioner and/or fixture for a device under test (DUT), comprising a first positioning and/or fixing connector adapted for being detachably mounted to a DUT, and comprising a second positioning and/or fixing connector adapted for mounting to a test arrangement, the first positioning and/or fixing connector and the second positioning and/or fixing connector being adapted to automatically interact with each other to provide a positioning and/or fixing with respect to each other by automatically effecting a positive form-fit interaction and/or for non-positive force-fit interaction, and further comprising elongated guiding elements, adapted for guiding the first positioning and/or fixing connector into a fixing position with respect to the second positioning and/or fixing connector.

The afore mentioned modular positioner and/or fixture according to the first or second aspect in particular provide the advantage of quick and secure positioning, fixing and fastening by means of an afore described modular positioner and/or fixture, in particular comprising said afore described elongated guiding elements. Positioning and fixing can be performed in a way that is highly precise and repeatable. In addition, a modular positioner and/or fixture according to the first or second aspect allows reduction of changeover time as preparation of a DUTs is already possible outside a test chamber. Any appropriate shape and/or size of elongated guiding elements is possible in the context of this disclosure.

The afore mentioned modular positioner and/or fixture according to the first or second aspect can be configured to work with or in other aspects or embodiments of the disclosure as described in this document, and can include any individual feature or any combination of features of other aspects or embodiments of the disclosure as described in this document, including the use of or with a method preferably implemented in the form of a data processing program product according to any of the aspects or embodiments as described in this document. Such modular positioner and/or fixture can be configured to perform a method according to any embodiment as described before, as well as to incorporate any of the technical features of any other embodiment of the disclosure as described in this document, and/or to contribute to the execution of an embodiment in the form of a data processing program product as described in this document.

According to an aspect of the disclosure, in an aspect or in an arrangement as described before, as well as in the other embodiments of the disclosure as described in this document, an elongated guiding element or a plurality of elongated guiding elements, in particular a guiding pin or a plurality of guiding pins is arranged offset from a central axis of a first positioning and/or fixing connector. Such offset arrangement in particular has the advantage of highly secure, precise and repeatable positioning and/or guiding.

According to an aspect of the disclosure, in any of the aspects or arrangements as described before, as well as in the other embodiments of the disclosure as described in this document, an elongated guiding element or a plurality of elongated guiding elements, in particular a guiding pin or a plurality of guiding pins is adapted to interact with a guiding recess or with a plurality of guiding recesses, thereby effecting a positive form-fit interaction and/or a non-positive force-fit interaction. Any appropriate shape and/or size of recesses and respective guiding elements is possible in the context of this disclosure.

According to an aspect of the disclosure, in any of the aspects or arrangements as described before, as well as in the other embodiments of the disclosure as described in this document, a first positioning and/or fixing connector or a second positioning and/or fixing connector comprises an elongated fixing element, in particular a clamping spigot, adapted for positive form-fit interaction and/or for non-positive force-fit interaction with a fixing arrangement, in particular with a clamping arrangement, such fixing arrangement or clamping arrangement being arranged in the respective other positioning and/or fixing connector.

According to an aspect of the disclosure, in any of the aspects or arrangements as described before, as well as in the other embodiments of the disclosure as described in this document, a fixing arrangement, in particular a clamping arrangement, is configured as electrically or electronically controlled and/or as electrically or electronically actuated fixing arrangement, controllable via electrical or electronical control commands. Such electrically or electronically controlled and/or electrically or electronically actuated fixing arrangement provides very fast fixing of a DUT. The electrically or electronically controlled and/or electrically or electronically actuated fixing arrangement can be controlled locally within the modular positioner and/or fixture and/or within a respective DUT measurement system, or it can be remotely controlled via electrical or electronical control commands from any control system at any distance from the fixing arrangement.

According to an aspect of the disclosure, in any of the aspects or arrangements as described before, as well as in the other embodiments of the disclosure as described in this document, interaction of a first positioning and/or fixing connector with a respective second positioning and/or fixing connector to effect a positive form-fit interaction and/or for non-positive force-fit interaction can be actuated by an actuator or by a plurality of actuators, in particular by an electrical actuator controllable via electrical or electronical control commands.

According to an aspect of the disclosure, in any of the aspects or arrangements as described before, as well as in the other embodiments of the disclosure as described in this document, an actuator or a plurality of actuators is electrically or electronically connected to a proximity sensor or to a plurality of proximity sensors, in particular to a proximity switch. An advantage of providing such proximity sensor or a plurality of proximity sensors is an automatic, quick and reliable fastening of an afore described modular positioner and/or fixture, and incorrect operation of the positioner and/or fixture by a user or any incomplete fastening or unintentional unfastening can be prevented in an automatic manner. Any useful type of proximity sensor is possible, such as a mechanical, electrical or optical sensor.

According to an aspect of the disclosure, in any of the aspects or arrangements as described before, as well as in the other embodiments of the disclosure as described in this document, a first positioning and/or fixing connector and a respective second positioning and/or fixing connector comprise an electrical connector or a plurality of electrical connectors. In that way, an electrical connection between a DUT and a test arrangement can be established in an easy, quick and reliable way via said first positioning and/or fixing connector and a respective second positioning and/or fixing connector.

According to a further aspect, the present disclosure provides a measurement system for a device under test (DUT), comprising a modular positioner and/or fixture, in particular comprising a modular positioner and/or fixture according to any of the aspects or arrangements as described before and/or implementing a method or a data processing program product according to any of the aspects as described in this document or implementing individual features or a combination of features of a method or of a data processing program product according to any of the aspects as described in this document, in particular a measurement system for a device under test (DUT) comprising a modular positioner and/or fixture, in particular comprising a test arrangement, and comprising a first positioning and/or fixing connector or a plurality of first positioning and/or fixing connectors adapted for being detachably mounted to a DUT using a fastening element or a plurality of fastening elements adapted for positive form-fit connection and/or for non-positive force-fit connection, and comprising a second positioning and/or fixing connector or a plurality of second positioning and/or fixing connectors mounted to said test arrangement, the or each first positioning and/or fixing connector being adapted to interact with a respective second positioning and/or fixing connector to provide a positioning and/or fixing of a DUT, thereby effecting a positive form-fit interaction and/or for non-positive force-fit interaction, and further comprising an elongated guiding element or a plurality of elongated guiding elements, in particular a guiding pin or a plurality of guiding pins, said guiding element or elements being adapted for guiding the first positioning and/or fixing connector into a fixing position with respect to the second positioning and/or fixing connector.

In such measurement system for a device under test (DUT), the afore mentioned modular positioner and/or fixture provides the advantage of quick and secure positioning, fixing and fastening. Positioning and fixing can be performed in a way that is highly precise and repeatable. In addition, a modular positioner and/or fixture according to this aspect allows reduction of changeover time as preparation of a DUTs is already possible outside a test chamber comprising the afore mentioned test arrangement.

According to an aspect of the disclosure, in a system as described before, and/or in combination with any feature or with a plurality of features of any of the aspects or arrangements as described before, as well as in any other embodiment of the disclosure as described in this document, the test arrangement is arranged in an anechoic chamber, adapted to allow a removable introduction of a DUT. Such arrangement in an anechoic chamber allows an effective shielding, and such use is possible as the afore mentioned modular positioner and/or fixture allows mounting of a first positioning and/or fixing connector or a plurality of first positioning and/or fixing connectors already outside the anechoic chamber.

According to an aspect of the disclosure, in a system as described before, and/or in combination with any feature or with a plurality of features of any of the aspects or arrangements as described before, as well as in any other embodiment of the disclosure as described in this document, a touch sensitive sensor is provided, arranged in electrical or electronical connection with an electrical actuator or with a plurality of electrical actuators controllable via electrical or electronical control commands and configured to actuate an electrically or electronically actuated fixing arrangement or a plurality of electrically or electronically actuated fixing arrangements provided in said second positioning and/or fixing connector or in said plurality of second positioning and/or fixing connectors. Any appropriate type of touch sensitive sensor can be used in the context of this disclosure, such as a touch display or an electrical or electronical switch adapted for operation by a user.

According to a further aspect, the present disclosure provides a data processing program product adapted for operating a measurement system for a device under test (DUT), in particular adapted for implementing a method for operating a for operating a measurement system for a device under test (DUT), in particular a measurement system for a device under test (DUT) according to any of the aspects or arrangements as described before, in particular in using a modular positioner and/or fixture according to any of the aspects or arrangements as described before, said data processing program product comprising instructions which, when the program is executed by a data processing unit, cause the data processing unit to carry out program steps adapted to implement a method according to any according to any of the aspects as described before, in particular in an arrangement or in an assembly according to any of the aspects as described before.

Such afore mentioned data processing program product can be configured to perform a method according to any embodiment as described in this document, as well as to incorporate any of the technical features of any other embodiment of the disclosure as described in this document, and to be executed in any of the arrangements or in any of the assemblies as described in this document. A possible realization of such data processing program product will be described with in the following further aspect of the disclosure.

According to an aspect of the disclosure, the present disclosure provides a data processing program product adapted for operating a measurement system for a device under test (DUT), in particular a data processing program according to the previous aspect of the disclosure, in particular adapted for implementing a method for operating a for operating a measurement system for a device under test (DUT), in particular for operating a measurement system for a device under test (DUT) according to any of the aspects or arrangements as described before or in any of the arrangements or in any of the assemblies as described in this document, in particular in using a modular positioner and/or fixture according to any of the aspects or arrangements as described before or in any of the arrangements or in any of the assemblies as described in this document, said data processing program product comprising instructions which, when the program is executed by a data processing unit, cause the data processing unit to carry out the following program steps:

a first program step of reading first control data from a proximity sensor or from a plurality of proximity sensors;

a second program step of actuating an actuator or a plurality of actuators using electrical or electronical control commands to actuate an electrically or electronically actuated fixing arrangement or a plurality of electrically or electronically actuated fixing arrangements into a fixing status;

a third program step of initiating an electrical connection and/or a data connection from a second positioning and/or fixing connector and/or from a test arrangement to a first positioning and/or fixing connector and/or to a DUT via an electrical connector or via a plurality of electrical connectors;

a fourth program step of indicating data representing the fixing status and/or data connection status of the fixing connectors to a user;

a fifth program step of starting a predefined test procedure for said DUT;

a sixth program step of reading second control data from a touch sensitive sensor;

a seventh program step of actuating an actuator or a plurality of actuators using electrical or electronical control commands to actuate an electrically or electronically actuated fixing arrangement or a plurality of electrically or electronically actuated fixing arrangements into a release status; and an eighth program step of indicating data representing the release status and/or data connection release status of the fixing connectors to a user.

Such afore mentioned data processing program product can be configured to perform a method according to any embodiment as described in this document, as well as to incorporate any of the technical features of any other embodiment of the disclosure as described in this document, and to be executed in any of the arrangements or in any of the assemblies as described in this document. Such afore mentioned data processing program product in particular supports in an efficient way the quick and secure positioning, fixing, fastening and releasing of a DUT positioner and/or fixture using an afore mentioned modular positioner and/or fixture, so that positioning, fixing and releasing can be performed in a way that is highly precise and repeatable.

The embodiments described above can be combined with each other as desired, if useful. Further possible embodiments, further configurations and implementations of the disclosure also include combinations, not explicitly mentioned, of features of the disclosure described herein with respect to the embodiments. In particular, the skilled person will thereby also add individual aspects as improvements or additions to the respective basic form of the present disclosure.

Still other aspects, features, and advantages of the present disclosure are readily apparent from the following detailed description, simply by illustrating a number of particular embodiments and implementations, including the best mode contemplated for carrying out the present disclosure. The present disclosure is also capable of other and different embodiments, and its several details can be modified in various obvious respects, all without departing from the spirit and scope of the present disclosure. Accordingly, the drawing and description are to be regarded as illustrative in nature, and not as restrictive.

BRIEF DESCRIPTION OF THE DRAWINGS

For a more comprehensive understanding of the disclosure and the advantages thereof, exemplary embodiments of the disclosure are explained in more detail in the following description with reference to the accompanying figures, in which like reference characters designate like parts and in which the following is shown.

The accompanying drawings are included to provide a further understanding of the present disclosure and are incorporated in and constitute a part of this specification. The drawings illustrate particular embodiments of the disclosure and together with the description serve to explain the principles of the disclosure. Other embodiments of the disclosure and many of the attendant advantages of the disclosure will be readily appreciated as they become better understood with reference to the following detailed description.

It will be appreciated that common and/or well understood elements that may be useful or necessary in a commercially feasible embodiment are not necessarily depicted in order to facilitate a more abstracted view of the embodiments. The elements of the drawings are not necessarily illustrated to scale relative to each other. It will further be appreciated that certain actions and/or steps in an embodiment of a method or of a data processing program product may be described or depicted in a particular order of occurrences while those skilled in the art will understand that such specificity with respect to sequence is not actually required. It will also be understood that the terms and expressions used in the present specification have the ordinary meaning as is accorded to such terms and expressions with respect to their corresponding respective areas of technology, except where specific meanings have otherwise been set forth herein.

DETAILED DESCRIPTION OF EMBODIMENTS

As will be explained with reference to the FIGS. 1 to 9, the present disclosure relates to a positioner and/or fixture for a device under test (DUT), to a measurement system for a device under test (DUT) and to a data processing program product for use with an afore mentioned positioner and/or fixture for a device under test (DUT) and/or with an afore mentioned measurement system for a device under test (DUT). In the following description, for the purposes of explanation, numerous specific details are set forth in order to provide a thorough understanding of the disclosure. It is apparent, however, that the disclosure may be practiced without these specific details or with an equivalent arrangement. In other instances, well-known structures and devices are shown schematically or in block diagram form in order to avoid unnecessarily obscuring the disclosure.

Figure 1:
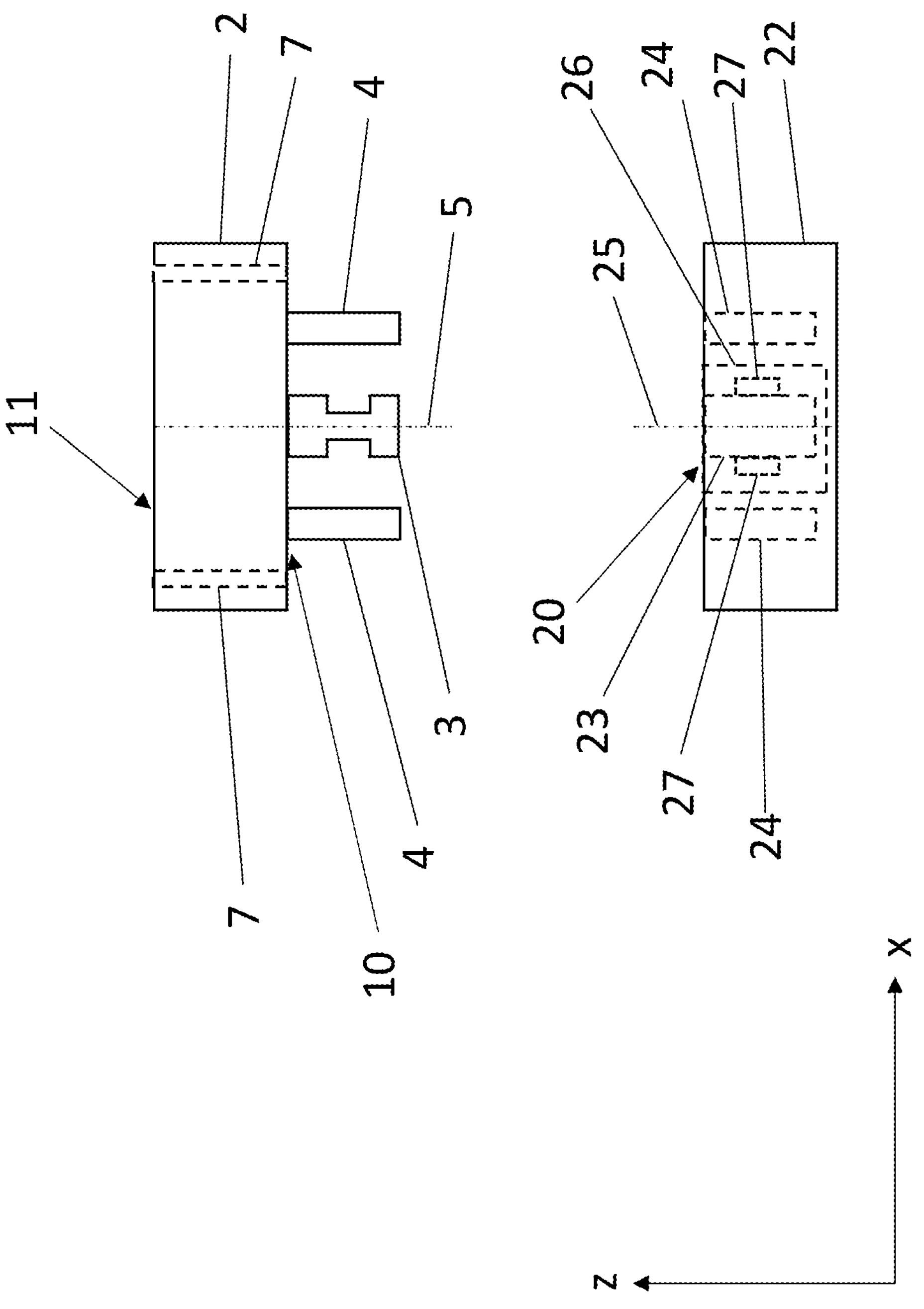
FIG. 1 a schematic side view of a modular positioner and/or fixture for a device under test (DUT) according to a specific embodiment of the disclosure.

With reference to FIG. 1 of the drawings, a schematic side view of a modular positioner and/or fixture for a device under test (DUT) according to a specific embodiment of the disclosure is depicted. In FIG. 1, a modular positioner and/or fixture for a DUT (not depicted in FIG. 1) is shown, comprising a first positioning and/or fixing connector 2 adapted for being detachably mounted to a DUT and comprising a second positioning and/or fixing connector 22, adapted for being mounted to a test arrangement (not depicted in FIG. 1).

Figure 2:
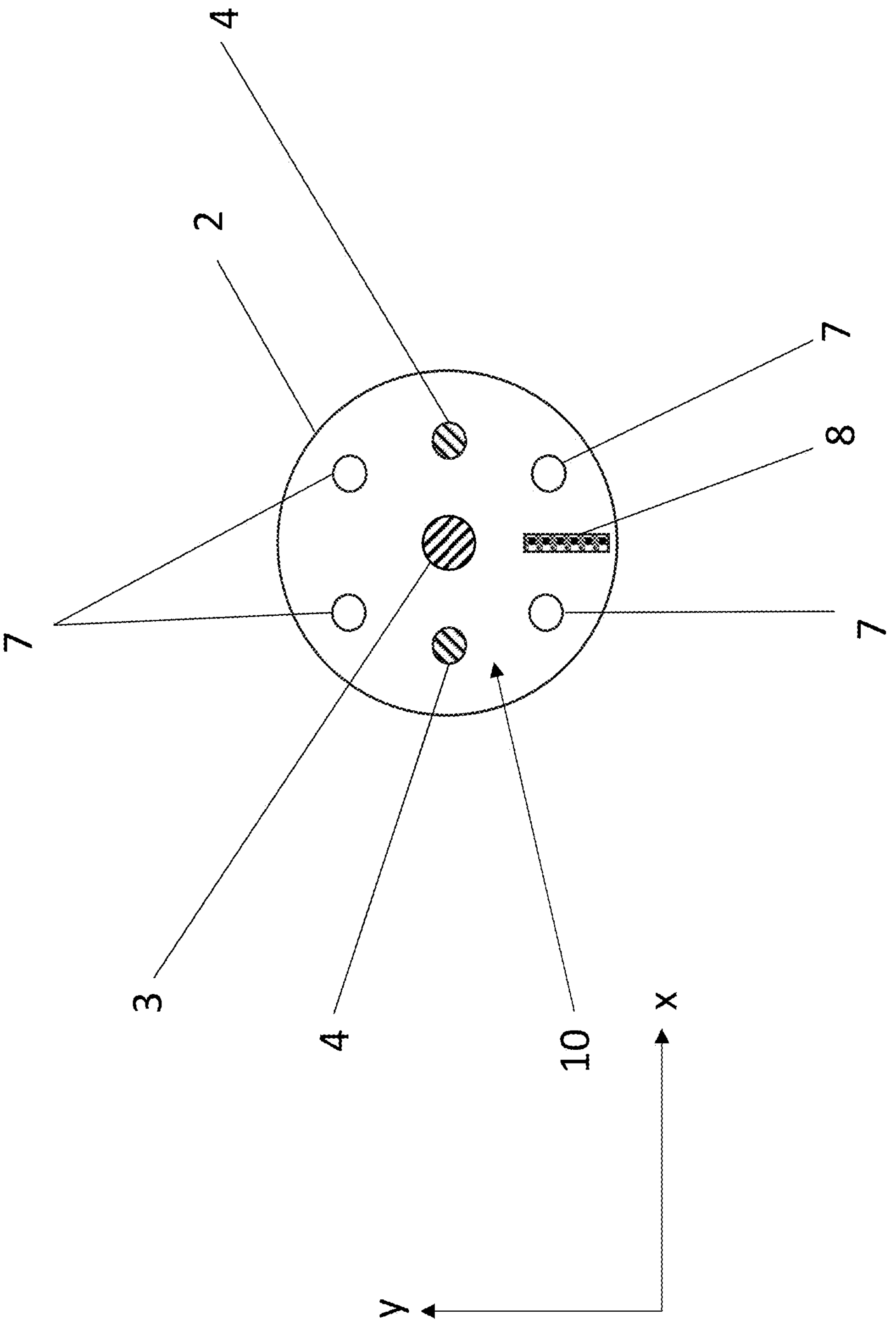
FIG. 2 a schematic top view of a first positioning and/or fixing connector of a modular positioner and/or fixture for a device under test (DUT) according to the specific embodiment of the disclosure according to FIG. 1.
Figure 3:
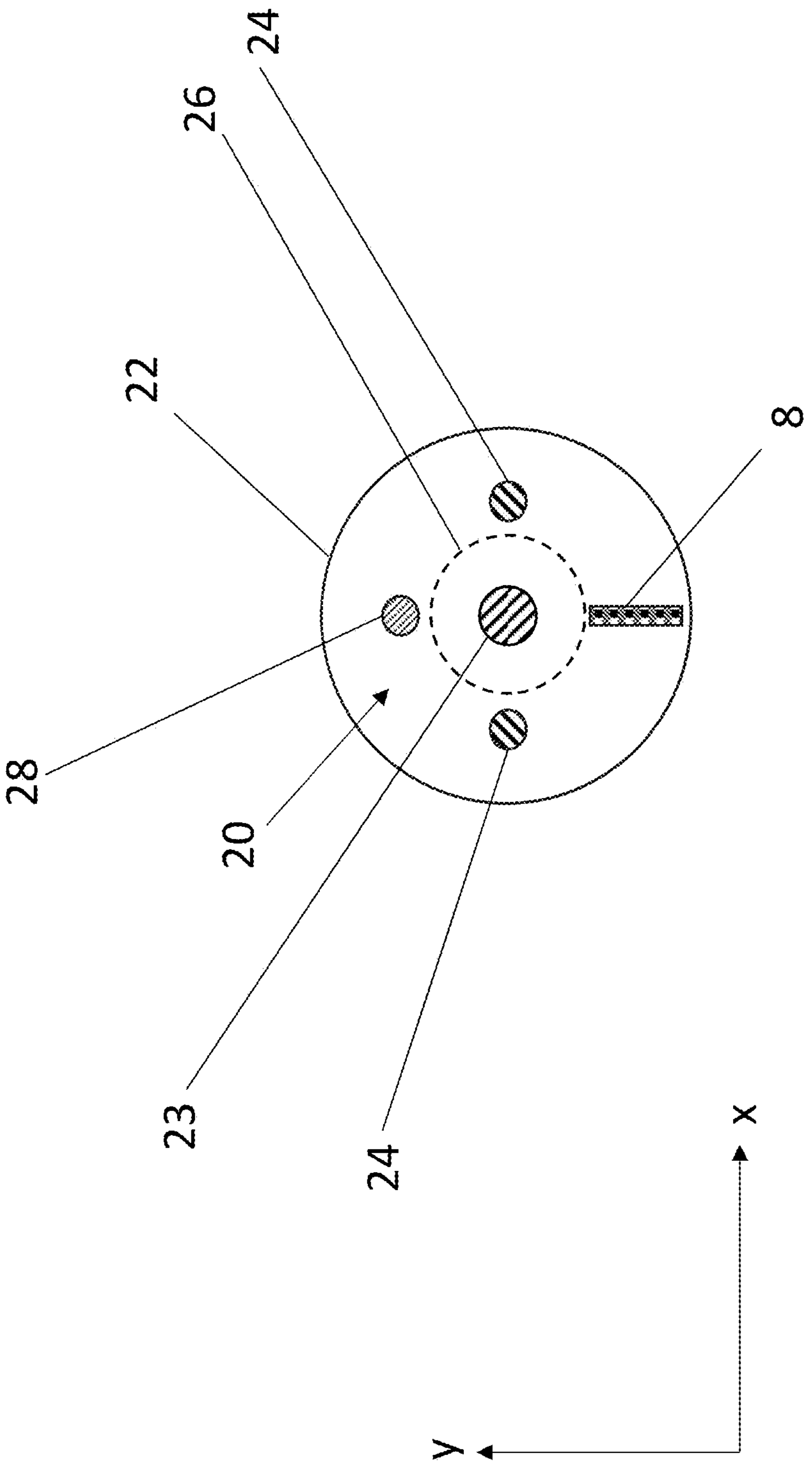
FIG. 3 a schematic top view of a second positioning and/or fixing connector of a modular positioner and/or fixture for a device under test (DUT) according to the specific embodiment of the disclosure according to FIG. 1.

FIG. 2 depicts a schematic top view of a first positioning and/or fixing connector of a modular positioner and/or fixture for a DUT according to the specific embodiment of the disclosure according to FIG. 1, to visualize additional details of the first positioning and/or fixing connector 2 according to the specific embodiment of the disclosure according to FIG. 1 from a different perspective. FIG. 3 accordingly depicts a schematic top view of a second positioning and/or fixing connector of a modular positioner and/or fixture for a DUT according to the specific embodiment of the disclosure according to FIG. 1, to visualize additional details of the second positioning and/or fixing connector 2 according to the specific embodiment of the disclosure according to FIG. 1 from a different perspective.

The first positioning and/or fixing connector 2 according to the specific embodiment of the disclosure according to FIG. 1, FIG. 2 and FIG. 3, comprises a plurality of fastening recesses 7, adapted for interaction with a plurality of fastening elements. The fastening recesses 7 are arranged such that said first positioning and/or fixing connector 2 according to the specific embodiment of the disclosure according to FIG. 1, FIG. 2 and FIG. 3 can be detachably mounted to a DUT (not shown in FIG. 1, FIG. 2 and FIG. 3) using fastening elements adapted for a positive form-fit connection and/or for a non-positive force-fit connection. Said fastening recesses 7 are opening towards a first surface 10 of the first positioning and/or fixing connector 2 and extending through said first positioning and/or fixing connector 2 towards an opposite surface 11 of said first positioning and/or fixing connector 2. A DUT can be mounted to said opposite surface 11 of said first positioning and/or fixing connector 2. Both surfaces, said first surface 10 and said opposite surface 11 of said first positioning and/or fixing connector 2 are parallel to each other and extending in a plane xy, as can be understood from FIG. 1, FIG. 2 and FIG. 3 in conjunction with FIG. 4, FIG. 5 and FIG. 6.

According to the specific embodiment of the disclosure according to FIG. 1, FIG. 2 and FIG. 3, the depicted first positioning and/or fixing connector 2 is adapted to interact with the depicted second positioning and/or fixing connector 22 to provide a positioning and/or fixing of said first positioning and/or fixing connector 2 with respect to said second positioning and/or fixing connector 22, thereby allowing a positioning and/or fixing of said DUT to which the first positioning and/or fixing connector 2 can be mounted. The positioning and/or fixing is effected by way of a positive form-fit interaction and/or by way of a non-positive force-fit interaction between said first positioning and/or fixing connector 2 and said second positioning and/or fixing connector 22.

Figure 5:
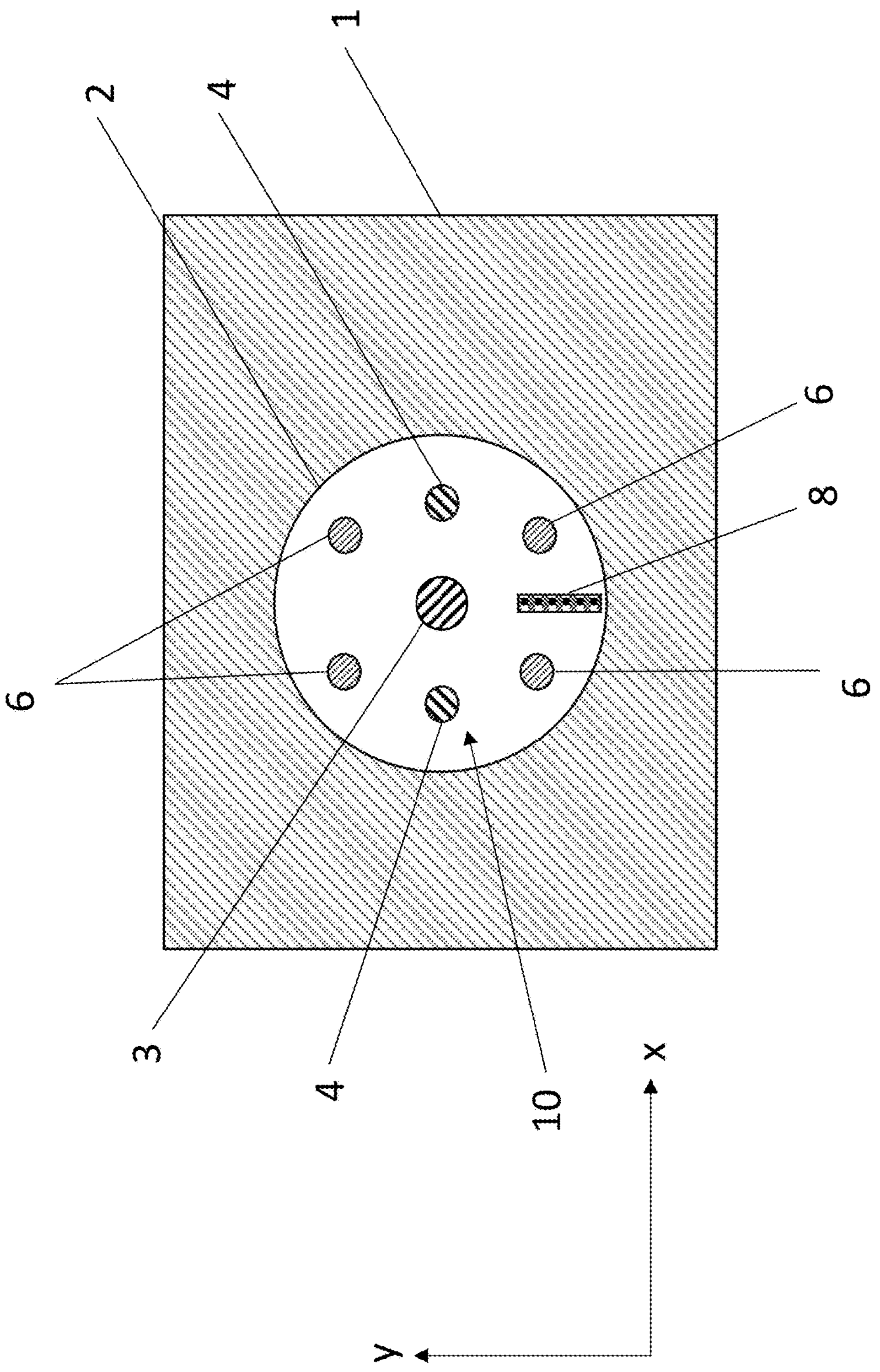
FIG. 5 a schematic top view of a first positioning and/or fixing connector of a modular positioner and/or fixture mounted to a device under test (DUT) according to the specific embodiment of the disclosure according to FIG. 1 to FIG. 4.
Figure 6:
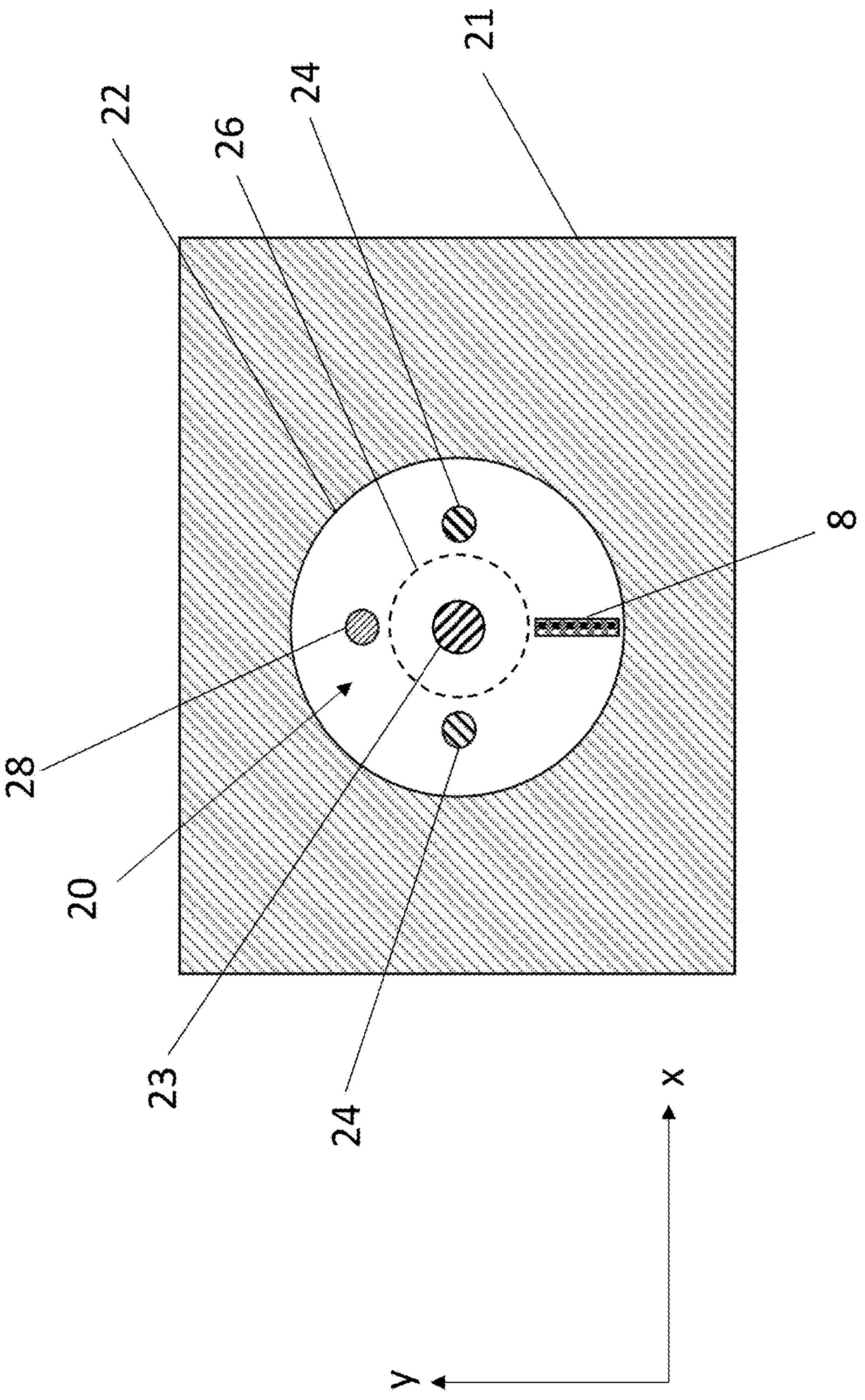
FIG. 6 a schematic top view of a second positioning and/or fixing connector of a modular positioner and/or fixture mounted to a test arrangement according to the specific embodiment of the disclosure according to FIG. 1 to FIG. 4.

According to the specific embodiment of the disclosure according to FIG. 1, FIG. 2 and FIG. 3, the modular positioner and/or fixture further comprises two elongated guiding elements 4 configured as guiding pins 4. Said guiding elements 4, i.e. guiding pins 4, are adapted for guiding the first positioning and/or fixing connector 2 into a fixing position with respect to the second positioning and/or fixing connector 22. Thereby, each of the guiding elements 4, i.e. guiding pins 4, is provided on the first surface 10 of the first positioning and/or fixing connector 2, said first surface 10 extending in a plane xy, as shown in FIG. 2 and FIG. 5. Each of the guiding elements 4, i.e. guiding pins 4, is interacting with a respective guiding recess 24 provided in the second positioning and/or fixing connector 22 and opening towards a respective second surface 20 of the second positioning and/or fixing connector 22, said first surface 10 extending in a plane xy as shown in FIG. 3 and FIG. 6, and said second surface 20 being arranged parallel to the first plane 10 (i.e. in a parallel plane xy) in a fixing status of the modular positioner and/or fixture, where the first plane 10 and second plane 20 are arranged parallel to each other and directly adjacent to each other, i.e. touching each other.

According to the specific embodiment of the disclosure according to FIG. 1, FIG. 2 and FIG. 3, the elongated guiding elements 4, i.e. said guiding pin 4 are each arranged offset from a central axis 5 of said first positioning and/or fixing connector 2, and—accordingly—said respective guiding recesses 24 provided in the second positioning and/or fixing connector 22 are each are arranged offset from a central axis 25 of said second positioning and/or fixing connector 22. Both central axis 5, 25 are arranged in a spatial direction z, which is perpendicular to a plane xy as shown in FIG. 1 to FIG. 3. In a fixing status of the modular positioner and/or fixture, both central axis 5, 25 are aligned and coincide to form a common effective central axis. When each of the guiding elements 4, i.e. guiding pins 4, is interacting with a respective guiding recess 24 provided in the second positioning and/or fixing connector 22, then each of the guiding elements 4, i.e. guiding pins 4, is effecting a positive form-fit interaction with a respective guiding recess 24.

According to the specific embodiment of the disclosure according to FIG. 1, FIG. 2 and FIG. 3, the depicted first positioning and/or fixing connector 2 comprises an elongated fixing element 3, i.e. a clamping spigot 3, adapted for positive form-fit interaction and/or for non-positive force-fit interaction with a fixing arrangement 26, i.e. with a clamping arrangement 26, such fixing i.e. clamping arrangement 26 being arranged in the respective other—i.e. second—positioning and/or fixing connector 22. Said fixing element 3, i.e. said clamping spigot 3, is also provided on said first surface 10 of the first positioning and/or fixing connector 2, and said fixing element 3, i.e. said clamping spigot 3 in particular has a central axis that coincides with a central axis 5 of said first positioning and/or fixing connector 2. Said fixing arrangement 26, i.e. said clamping arrangement 26, is opening towards said respective second surface 20 of the second positioning and/or fixing connector 22.

As will be explained in the following, the fixing arrangement 26, i.e. clamping arrangement 26, is configured as an electrically or electronically controlled and/or as electrically or electronically actuated fixing arrangement 26, i.e. clamping arrangement 26, controllable via electrical or electronical control commands. An interaction of said first positioning and/or fixing connector 2 with said respective second positioning and/or fixing connector 22 to effect a positive form-fit interaction and/or for non-positive force-fit interaction can be actuated by a clamping actuator 27 or by a plurality of clamping actuators 27 provided in the electrically or electronically actuated fixing arrangement 26, i.e. in the clamping arrangement 26, in particular by an electrical clamping actuator 27 controllable via electrical or electronical control commands which has a shape and/or a design adapted for a positive form-fit interaction and/or for non-positive force-fit interaction with the shape and/or the design of said fixing element 3, i.e. said clamping spigot 3.

As depicted in FIG. 3 (and later in FIG. 6) and as will be explained later with respect to FIG. 7 and FIG. 8, a proximity sensor 28, in particular a proximity switch 28, can be provided, in particular in or on the second positioning and/or fixing connector 22. Said proximity sensor 28, in particular a proximity switch 28, can be provided on said second surface 20 of said second positioning and/or fixing connector 22. Said actuator 27 can be electrically or electronically connected to said proximity sensor 28, in particular to said proximity switch 28, such that said actuator 27 can be actuated depending on the distance between said first positioning and/or fixing connector 2 and said second positioning and/or fixing connector 22. In particular, said actuator 27 can be automatically actuated using electrical or electronical control commands based on sensor data and/or electrical or electronical signals created by said proximity sensor 28, in particular by said proximity switch 28, when the distance between said first positioning and/or fixing connector 2 and said second positioning and/or fixing connector 22 falls below a certain predefined minimum distance threshold, in particular when the first surface 10 of said first positioning and/or fixing connector 2 and the second surface 20 of said second positioning and/or fixing connector 22 get in contact to each other i.e. when the distance between said first positioning and/or fixing connector 2 and said second positioning and/or fixing connector 22 is equal to zero.

As depicted in FIG. 2 and FIG. 3, the first positioning and/or fixing connector 2 and the respective second positioning and/or fixing connector 22 each comprise an electrical connector or a plurality of electrical connectors 8, adapted to interact with each other in order to establish an electrical and/or electronical connection and/or data connection between and via said first positioning and/or fixing connector 2 and the respective second positioning and/or fixing connector 22, such as power connection, ethernet connection, HF connection, fiber connection. Thereby, an electrical and/or electronical connection and/or data connection between a DUT and a test arrangement can automatically be established in a simple, secure and reliable way. Alternatively, an electrical and/or electronical and/or data connection between a DUT and a test arrangement can be established manually after positioning and/or fixing a DUT to a respective test arrangement.

The schematic view according to FIG. 1, FIG. 2 and FIG. 3 is only a simplified representation of the main features of a first embodiment of the disclosure, with the intention to visualize the main functionalities of the disclosure. The arrangement, size and shape of the individual functional elements may be varied. In particular the arrangement, shape and size of the different elements, features and arrangements may vary, and may have a shape different to the shape as depicted in FIG. 1, FIG. 2 and FIG. 3.

FIG. 4 to FIG. 8 depict a specific embodiment of measurement system for a device under test (DUT), comprising a modular positioner and/or fixture. In particular, FIG. 4 to FIG. 8 depict a use of a modular positioner and/or fixture according to the specific embodiment as depicted in and as described with respect to FIG. 1, FIG. 2 and FIG. 3 in a specific embodiment of measurement system for a DUT. All descriptions, explanations, technical details and functionalities concerning elements, features and arrangements with the same reference numerals as depicted in and as described with respect to FIG. 1, FIG. 2 and FIG. 3 also apply to such elements, features and arrangements with the same reference numerals as depicted in FIG. 4 to FIG. 8. Consequently, for all elements, features and arrangements with the same reference numerals as depicted in and as described with respect to FIG. 1, FIG. 2 and FIG. 3, for reasons of simplicity, reference is made to the above descriptions, explanations, technical details and functionalities as depicted in and as described with respect to FIG. 1, FIG. 2 and FIG. 3.

Figure 4:
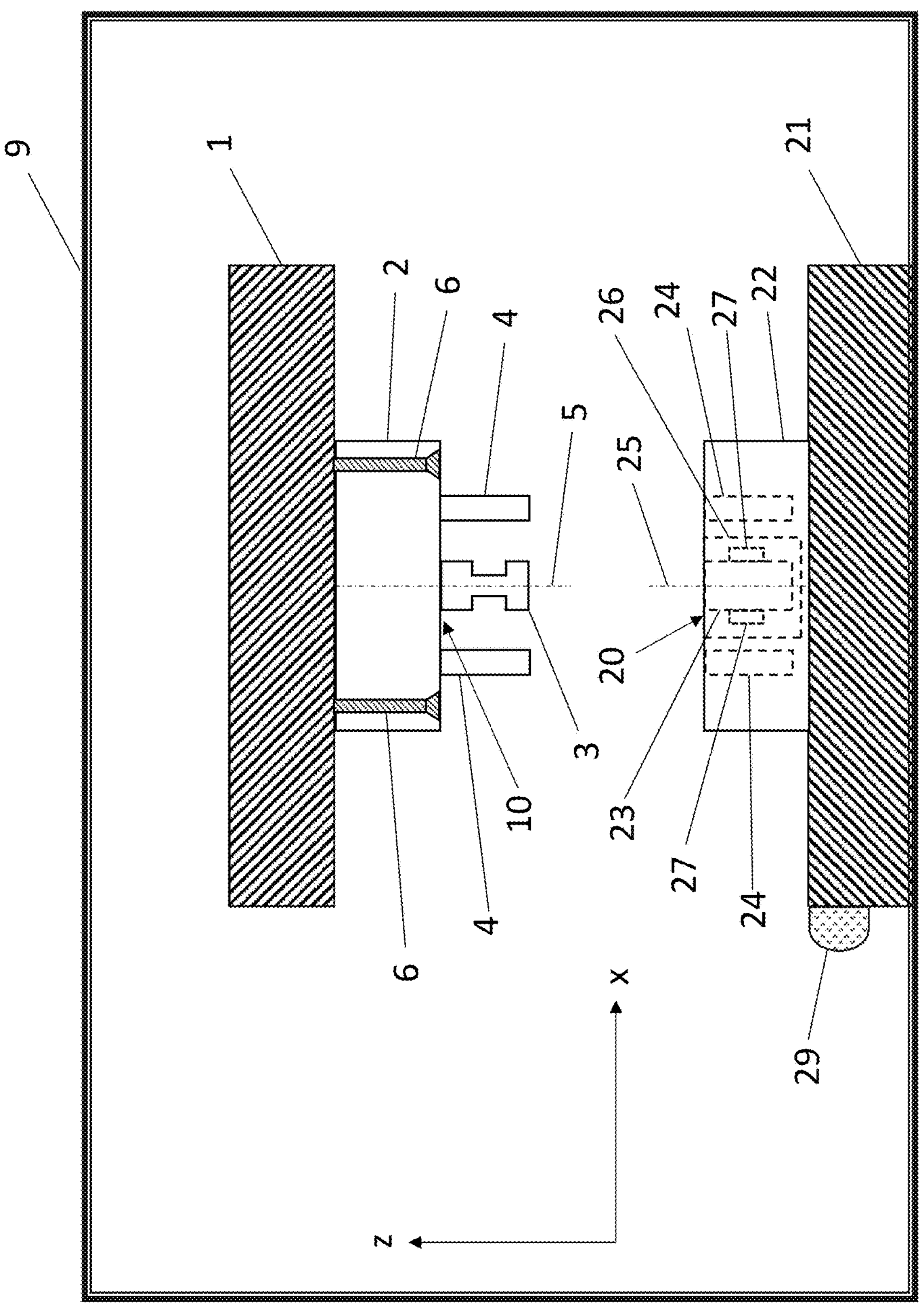
FIG. 4 a schematic (cross-sectional) side view of a measurement system for a device under test (DUT) comprising a modular positioner and/or fixture according to the specific embodiment of the disclosure according to FIG. 1 to FIG. 3.

FIG. 4 in particular depicts a specific embodiment of a measurement system for a DUT comprising a modular positioner and/or fixture according to the specific embodiment as depicted in FIG. 1, FIG. 2 and FIG. 3, the measurement system comprising a test arrangement 21 (for simplicity reasons depicted as a functional block) and a second positioning and/or fixing connector 22 as depicted in and as described with respect to FIG. 1, FIG. 2 and FIG. 3, which is mounted to said test arrangement 21. The test arrangement 21 is arranged in an anechoic chamber 9, and said anechoic chamber 9 adapted to allow a removable introduction of a DUT for testing.

The measurement system also comprises a first positioning and/or fixing connector 2 depicted in and as described with respect to FIG. 1, FIG. 2 and FIG. 3, which is detachably mounted to a DUT 1 (for simplicity reasons depicted as a functional block) using a plurality of fastening elements 6 adapted for positive form-fit connection and/or for non-positive force-fit connection.

As already described before with respect to FIG. 1, FIG. 2 and FIG. 3, also in this embodiment of the disclosure, the first positioning and/or fixing connector 2 is adapted to interact with the respective second positioning and/or fixing connector 22 to provide a positioning and/or fixing of the depicted DUT 1, thereby effecting a positive form-fit interaction and/or a non-positive force-fit interaction. As already described before with respect to FIG. 1, FIG. 2 and FIG. 3, also in this embodiment of the disclosure, a plurality of elongated guiding elements 4, in particular a plurality of guiding pins 4, is provided, such guiding elements 4 being adapted for guiding the first positioning and/or fixing connector 2 into a fixing position with respect to the second positioning and/or fixing connector 22, to enable a positioning and/or fixing of said DUT 1 with respect to said test arrangement 21. As already explained before with respect to FIG. 1, FIG. 2 and FIG. 3, with such arrangement and by means of the technical details and functionalities concerning features elements, and arrangements with the same reference numerals as depicted in and as described with respect to FIG. 1, FIG. 2 and FIG. 3, a quick, safe, secure and reliable positioning and/or fixing of said DUT 1 with respect to said test arrangement 21 can be achieved.

As already described before with respect to FIG. 1, FIG. 2 and FIG. 3, also in this embodiment of the disclosure, an elongated fixing element 3, i.e. a clamping spigot 3, is provided and adapted for positive form-fit interaction and/or for non-positive force-fit interaction with a fixing arrangement 26, i.e. with a clamping arrangement 26. As described before, the fixing arrangement 26, i.e. clamping arrangement 26, is configured as an electrically or electronically controlled and/or as electrically or electronically actuated fixing arrangement 26. Reference is made again to all elements, features and arrangements with the same reference numerals as depicted in and as described with respect to FIG. 1, FIG. 2 and FIG. 3.

As depicted in FIG. 4, a touch sensitive sensor 29 can be provided (e.g. a touch display or an electrical or electronical switch adapted for operation by a user), arranged in an appropriate location accessible for a user ang being in electrical or electronical connection with an electrical actuator 27 as depicted in FIG. 4 and as described in more detail with respect to FIG. 1, FIG. 2 and FIG. 3 above. Such electrical actuator 27 can be controllable via electrical or electronical control commands and configured to actuate an electrically or electronically actuated fixing arrangement 26 provided in said second positioning and/or fixing connector 22 as described in more detail with respect to FIG. 1, FIG. 2 and FIG. 3 above. In particular, electrical or electronical control commands can actuate said actuator 27 in order to actuate an electrically or electronically actuated fixing arrangement 26 into a fixing status and/or into a release status. In case an afore mentioned proximity sensor 28, in particular a proximity switch 28, is provided in order to automatically actuate an electrically or electronically actuated fixing arrangement 26 into a fixing status, then the touch sensitive sensor 29 can be adapted to actuate said actuator 27 in order to actuate an electrically or electronically actuated fixing arrangement 26 into a release status only.

FIG. 5 depicts a schematic top view of a first positioning and/or fixing connector 2 of a modular positioning and/or fixing arrangement, similar to FIG. 2, so that for all elements, features and arrangements with the same reference numerals reference is made to the elements, features and arrangements as depicted in and as described with respect to FIG. 2. The first positioning and/or fixing connector 2 depicted in FIG. 5 is mounted to a DUT 1 according to the specific embodiment of the disclosure according to FIG. 1 to FIG. 4. The first positioning and/or fixing connector 2 is detachably mounted to the DUT 1 using a plurality of fastening elements 6 adapted for positive form-fit connection and/or for non-positive force-fit connection.

Accordingly, FIG. 6 depicts a schematic top view of a second positioning and/or fixing connector 22 of a modular positioner and/or fixture similar to FIG. 3, so that for all elements, features and arrangements with the same reference numerals reference is made to the elements, features and arrangements as depicted in and as described with respect to FIG. 3. The second positioning and/or fixing connector 2 depicted in FIG. 6 is mounted to a test arrangement 21 according to the specific embodiment of the disclosure according to FIG. 1 to FIG. 4.

Figure 7:
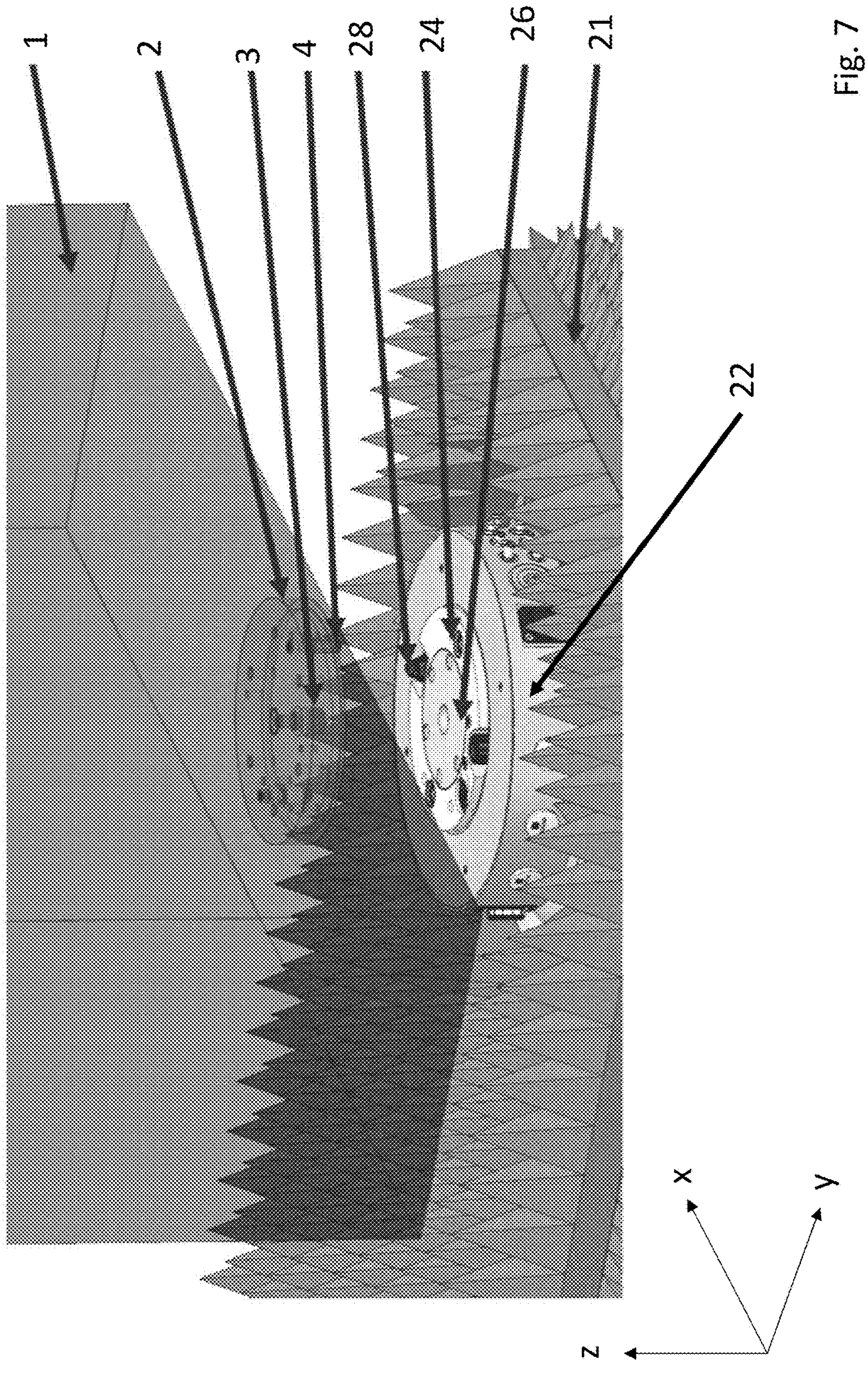
FIG. 7 a schematic perspective view of a measurement system for a device under test (DUT) according to a further specific embodiment of the disclosure, depicting in more detail a modular positioner and/or fixture.
Figure 8:
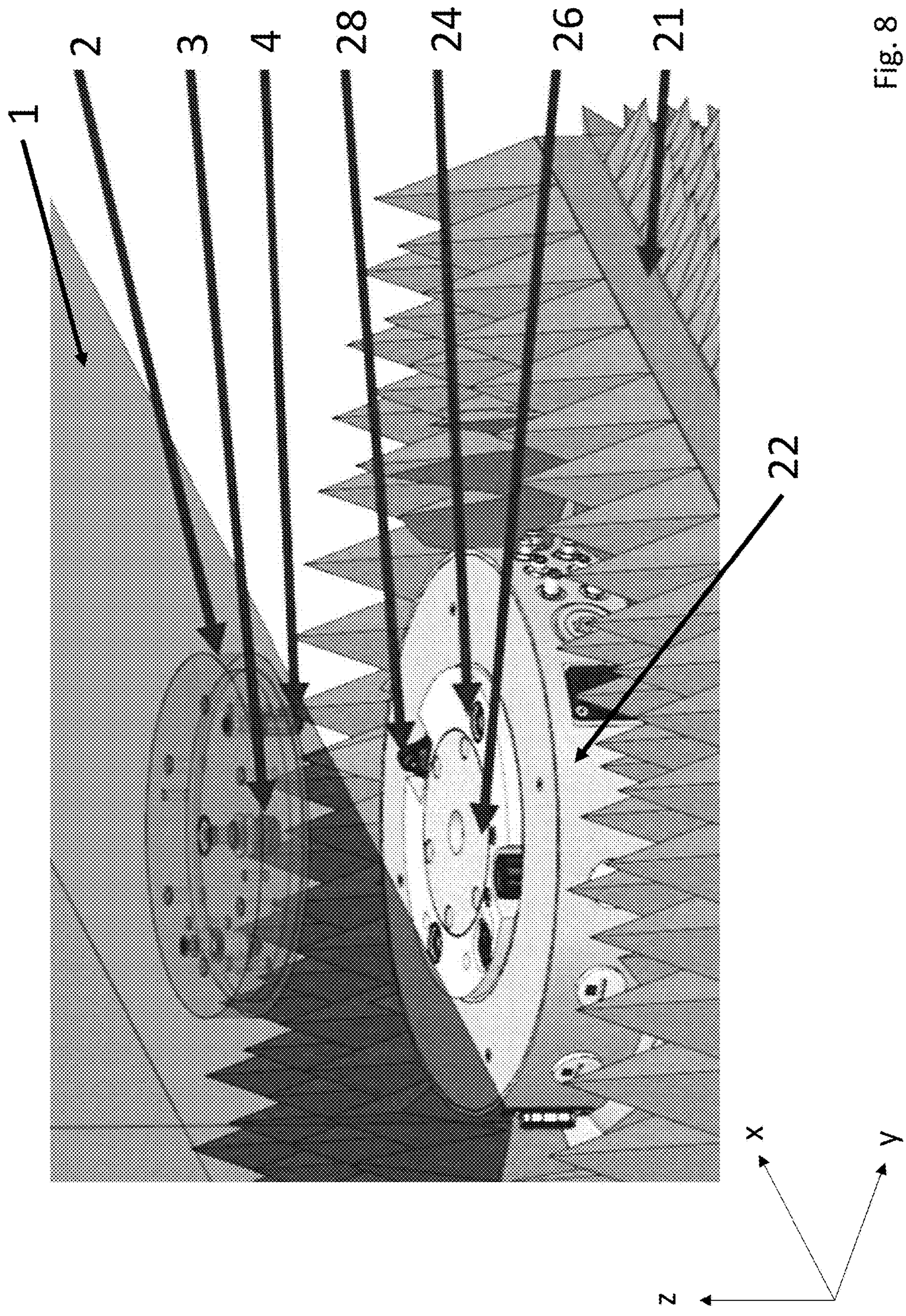
FIG. 8 an enlarged schematic perspective view of a measurement system for a device under test (DUT) according to the further specific embodiment of the disclosure according to FIG. 7.

In FIG. 7, a schematic perspective view of a measurement system for a DUT 1 is depicted according to a further specific embodiment of the disclosure, depicting in more detail a modular positioner and/or fixture. FIG. 8 shows an enlarged schematic perspective view of a measurement system for a DUT 1 according to the further specific embodiment of the disclosure according to FIG. 7. In particular, a specific embodiment depicting a possible arrangement of and/or a possible shape of a first positioning and/or fixing connector 2 and/or of a respective second positioning and/or fixing connector 22 and/or of guiding elements 4, in particular of guiding pins 4 and/or of guiding recesses 24 and/or of a fixing element 3, in particular of a clamping spigot 3 and/or of a proximity sensor 28, in particular of a proximity switch 28, are depicted.

As already described in the background of the disclosure and in previous patent applications of the same patent applicant who is applicant of this patent application, for a 3D measurement within a shielding chamber, such as an anechoic chamber 9, a DUT 1 must be fixed to a positioner. Depending on the type of positioner, a respective flange is either horizontal or vertical. The larger, more unwieldy and heavier the DUT 1 is, the more complex it is to pick up the DUT 1 as quickly and precisely as possible. As a rule, these two properties are opposed to each other. With this disclosure, it is possible that a simple and possibly inexpensive part i.e. a first positioning and/or fixing connector 2 of a DUT 1 fixture is attached to the DUT 1 outside the shielding chamber such as an anechoic chamber 9. The DUT fixture is then married to the rest of the positioner, i.e. to a second positioning and/or fixing connector 22 preferably by means of a quick-locking system that is highly precise, fast and tool-free. This means that even heavy DUTs 1 can be attached to vertical or horizontal positioner flanges very quickly and easily. In addition, the changeover time of the shielding chamber such as an anechoic chamber 9 is reduced, as the next DUT 1 can already be prepared for test outside the chamber 9.

The afore described electrically or electronically actuated clamping system is used to clamp a test specimen, i.e. a DUT 1. Such afore described clamping system can be integrated into a rotational axis of a respective positioner. A first positioning and/or fixing connector 2 which may be configured as an adapter plate as shown in FIG. 7 and FIG. 8 can be detachably mounted to the test specimen, i.e. to the DUT 1, for example using screws. A specifically adapted clamping spigot 3 and two guiding pins 4 are located offset from a central clamping spigot 3 on opposite sides of the clamping spigot 3 on this adapter plate as shown in FIG. 7 and FIG. 8. The guiding pins 4 are offset so that incorrect or twisted clamping can be avoided. These guiding pins 4 are inserted into the guiding recesses 24 provided when the test specimen the DUT 1 is changed. A proximity switch 28—that may also be acting as a safety switch—detects the proximity of said adapter plate and the clamping arrangement 26 closes and mechanically locks the connection into a fixing state as soon as the test specimen i.e. the DUT 1 is in contact with the test arrangement 21 and placed in the correct position with respect to the test arrangement 21. The afore described mechanical locking of the clamping arrangement 26 prevents a DUT 1 from falling out or being displaced unintentionally.

The clamping arrangement 26 can be unlocked using a touch sensitive sensor 29, such as an illuminated pushbutton, and the respective status of the clamping arrangement 26 can be visualized to a user by respective (different) illumination. If the clamping process has been completed correctly, the button may for example light up green. If the clamping arrangement 26 is in an open status, the button may for example flash blue and in the event of a fault, the button may for example flash yellow or red.

Figure 9:
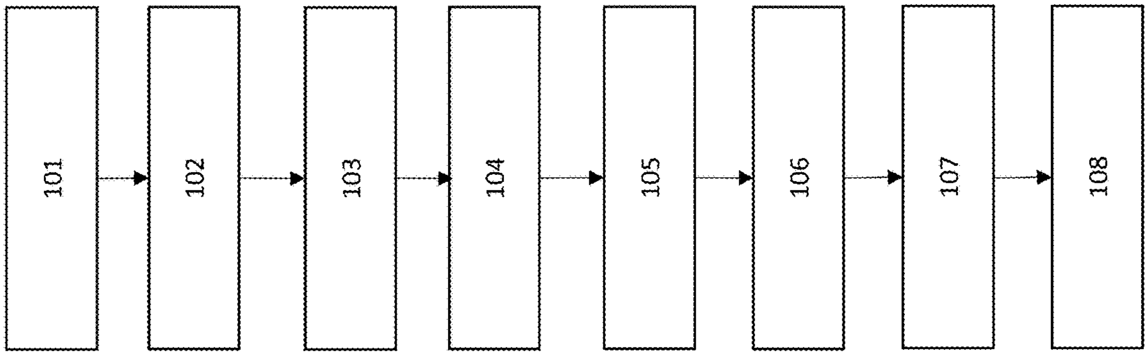
FIG. 9 a schematic flow diagram of subsequent steps of a specific embodiment of a data processing program product, implementing a specific embodiment of a method, according to a specific embodiment of the disclosure and for use with specific embodiments according to FIG. 1 to FIG. 8.

FIG. 9 depicts a schematic flow diagram of subsequent steps of a data processing program product according to a specific embodiment of the disclosure, implementing a method for operating a measurement system for a DUT 1 according to a specific embodiment of the disclosure, in particular a measurement system for a DUT 1 according to FIG. 4 to FIG. 8, and in particular in using a modular positioner and/or fixture according to FIG. 1 to FIG. 3. This specific embodiment of a data processing program product comprises instructions which, when the program is executed by a data processing unit, cause the data processing unit to carry out the following program steps:

- a first program step 101 of reading first control data from a proximity sensor 28 or from a plurality of proximity sensors 28;
- a second program step 102 of actuating an actuator 26, 27 or a plurality of actuators 26, 27 using electrical or electronical control commands to actuate an electrically or electronically actuated fixing arrangement 26 or a plurality of electrically or electronically actuated fixing arrangements 26 into a fixing status, in particular based on previously read first control data from a proximity sensor 28 or from a plurality of proximity sensors 28;
- a third program step 103 of initiating an electrical a data connection from a second connection and/or positioning and/or fixing connector 22 and/or from a test arrangement 21 to a first positioning and/or fixing connector 2 and/or to a DUT 1 via an electrical connector 8 or via a plurality of electrical connectors 8;
- a fourth program step 104 of indicating data representing the fixing status and/or data connection status of the fixing connectors 2, 22 to a user;
- a fifth program step 105 of starting a predefined test procedure for said DUT 1;
- a sixth program step 106 of reading second control data from a touch sensitive sensor 29;
- a seventh program step 107 of actuating an actuator 26, 27 or a plurality of actuators 26, 27 using electrical or electronical control commands to actuate an electrically or electronically actuated fixing arrangement 26 or a plurality of electrically or electronically actuated fixing arrangements 26 into a release status, in particular based on previously read second control data from a touch sensitive sensor 29; and an eighth program step 108 of indicating data representing the release status and/or data connection release status of the fixing connectors 2, 22 to a user.

Particular advantages of the disclosure are quick fastening by means of an afore described modular positioner and/or fixture in particular comprising said afore described guiding pins 4 and said afore described proximity switch 28 and said afore described clamping arrangement 26. Positioning and fixing of a DUT 1 can be performed in a way that is highly precise and repeatable due to the accuracy of the modular positioner and/or fixture comprising in particular said guiding pins 4 and said proximity switch 28 and said clamping arrangement 26. Reduction of the changeover time of the chamber as preparation of further DUTs is already possible outside a test chamber.

While various embodiments of the present disclosure have been described above, it should be understood that they have been presented by way of example only, and not limitation. Numerous changes to the disclosed embodiments can be made in accordance with the disclosure herein without departing from the spirit or scope of the disclosure. Thus, the breadth and scope of the present disclosure should not be limited by any of the above-described embodiments. Rather, the scope of the disclosure should be defined in accordance with the following claims and their equivalents.

Although specific embodiments of the disclosure are illustrated and described herein, it will be appreciated by those of ordinary skill in the art that a variety of alternate and/or equivalent implementations exist. It should be appreciated that the exemplary embodiment or exemplary embodiments are examples only and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

It will also be appreciated that in this document the terms “comprise”, “comprising”, “include”, “including”, “contain”, “containing”, “have”, “having”, and any variations thereof, are intended to be understood in an inclusive (i.e. non-exclusive) sense, such that the process, method, device, apparatus or system described herein is not limited to those features or parts or elements or steps recited but may include other elements, features, parts or steps not expressly listed or inherent to such process, method, article, or apparatus. Furthermore, the terms “a” and “an” used herein are intended to be understood as meaning one or more unless explicitly stated otherwise. Moreover, the terms “first”, “second”, “third”, etc. are used merely as labels, and are not intended to impose numerical requirements on or to establish a certain ranking of importance of their objects.

LIST OF REFERENCE SIGNS

1 Device Under Test DUT
2 first positioning and/or fixing connector
3 fixing element/clamping spigot
4 guiding element/guiding pin
5 first central axis
6 fastening element
7 fastening recess
8 electrical connector
9 anechoic chamber
10 first surface
11 opposite surface
20 second surface
21 test arrangement
22 second positioning and/or fixing connector
23 clamping recess
24 guiding recess
25 second central axis
26 fixing arrangement/clamping arrangement
27 clamping means/clamping actuator
28 proximity sensor/proximity switch
29 touch sensitive sensor

The invention claimed is:

1. A modular positioner and/or fixture for a device under test (DUT), comprising a first positioning and/or fixing connector or a plurality of first positioning and/or fixing connectors, adapted for being detachably mounted to a DUT;

a second positioning and/or fixing connector or a plurality of second positioning and/or fixing connectors, adapted for being mounted to a test arrangement;

the or each first positioning and/or fixing connector being adapted to automatically interact with a respective second positioning and/or fixing connector to provide a positioning and/or fixing of said DUT by automatically effecting a positive form-fit interaction and/or a non-positive force-fit interaction;

and further comprising an elongated guiding element or a plurality of elongated guiding elements, in particular a guiding pin or a plurality of guiding pins, said guiding element or elements being adapted for guiding the first positioning and/or fixing connector into a fixing position with respect to the second positioning and/or fixing connector;

wherein a clamping arrangement is arranged in a positioning and/or fixing connector; and interaction of a first positioning and/or fixing connector with the clamping arrangement in the respective second positioning and/or fixing connector to effect a positive form-fit interaction and/or a non-positive force-fit interaction can be actuated by an electrical actuator controllable via electrical or electronical control commands in order to actuate an electrically or electronically actuated fixing arrangement into a fixing status and/or into a release status;

said actuator being provided in the electrically or electronically actuated fixing arrangement.

2. A modular positioner and/or fixture according to claim 1, wherein said actuator or said plurality of actuators is electrically or electronically connected to a proximity sensor or to a plurality of proximity sensors, in particular to a proximity switch.

3. A modular positioner and/or fixture according to claim 1, wherein said elongated guiding element or a plurality of elongated guiding elements, in particular said guiding pin or said plurality of guiding pins is arranged offset from a central axis of said first positioning and/or fixing connector.

4. A modular positioner and/or fixture according claim 1, wherein said elongated guiding element or said plurality of elongated guiding elements, in particular said guiding pin or said plurality of guiding pins is adapted to interact with a guiding recess or with a plurality of guiding recesses, thereby effecting a positive form-fit interaction and/or a non-positive force-fit interaction.

5. A modular positioner and/or fixture according to claim 1, wherein said first positioning and/or fixing connector or said second positioning and/or fixing connector comprises an elongated fixing element, in particular a clamping spigot, adapted for positive form-fit interaction and/or for non-positive force-fit interaction with the fixing arrangement, in particular with the clamping arrangement, such fixing arrangement being arranged in the respective other positioning and/or fixing connector.

6. A modular positioner and/or fixture according to claim 5, wherein said fixing arrangement, in particular said clamping arrangement, is configured as electrically or electronically controlled and/or as electrically or electronically actuated fixing arrangement, controllable via electrical or electronical control commands.

7. A modular positioner and/or fixture according to claim 1, wherein a first positioning and/or fixing connector and a respective second positioning and/or fixing connector comprise an electrical connector or a plurality of electrical connectors.

8. A two-part positioner and/or fixture for a device under test (DUT), comprising a first positioning and/or fixing connector, adapted for being detachably mounted to a DUT;

a second positioning and/or fixing connector, adapted for being mounted to a test arrangement;

the first positioning and/or fixing connector being adapted to automatically interact with a respective second positioning and/or fixing connector to provide a positioning and/or fixing of said DUT by automatically effecting a positive form-fit interaction and/or a non-positive force-fit interaction;

wherein an electrically or electronically actuated fixing arrangement comprising a clamping arrangement is arranged in the second positioning and/or fixing connector; and interaction of the first positioning and/or fixing connector with the clamping arrangement in the respective second positioning and/or fixing connector to effect a positive form-fit interaction and/or a non-positive force-fit interaction can be actuated by an electrical actuator provided in the electrically or electronically actuated fixing arrangement, controllable via electrical or electronical control commands, in order to actuate the electrically or electronically actuated fixing arrangement into a fixing status and/or into a release status.

9. A modular positioner and/or fixture according to claim 8, further comprising an elongated guiding element or a plurality of elongated guiding elements, in particular a guiding pin or a plurality of guiding pins, said guiding element or elements being adapted for guiding the first positioning and/or fixing connector into a fixing position with respect to the second positioning and/or fixing connector.

10. A measurement system for a device under test (DUT) comprising a modular positioner and/or fixture, comprising:

a test arrangement;

one or a plurality of two-part positioners and/or fixtures for a device under test (DUT), comprising a first positioning and/or fixing connector, adapted for being detachably mounted to a DUT and a second positioning and/or fixing connector, adapted for being mounted to said test arrangement;

said first positioning and/or fixing connector or a plurality of first positioning and/or fixing connectors, adapted for being detachably mounted to a DUT using a fastening element or a plurality of fastening elements adapted for positive form-fit connection and/or for non-positive force-fit connection;

said second positioning and/or fixing connector or a plurality of second positioning and/or fixing connectors mounted to said test arrangement;

the or each first positioning and/or fixing connector being automatically adapted to interact with a respective second positioning and/or fixing connector to provide a positioning and/or fixing of a DUT by automatically effecting a positive form-fit interaction and/or a non-positive force-fit interaction;

and further comprising an elongated guiding element or a plurality of elongated guiding elements, in particular a guiding pin or a plurality of guiding pins, said guiding element or elements being adapted for guiding the first positioning and/or fixing connector into a fixing position with respect to the second positioning and/or fixing connector, wherein a clamping arrangement is arranged in a second positioning and/or fixing connector; and interaction of a first positioning and/or fixing connector with the clamping arrangement in the respective second positioning and/or fixing connector to effect a positive form-fit interaction and/or a non-positive force-fit interaction can be actuated by an electrical actuator controllable via electrical or electronical control commands in order to actuate an electrically or electronically actuated fixing arrangement into a fixing status and/or into a release status;

said actuator being provided in the electrically or electronically actuated fixing arrangement.

11. A measurement system for a device under test (DUT), according to claim 10, wherein the test arrangement is arranged in an anechoic chamber, adapted to allow a removable introduction of a DUT.

12. A measurement system for a device under test (DUT), according to claim 10, wherein a touch sensitive sensor is provided, arranged in electrical or electronical connection with an electrical actuator or with a plurality of electrical actuators controllable via electrical or electronical control commands and configured to actuate an electrically or electronically actuated fixing arrangement or a plurality of electrically or electronically actuated fixing arrangements provided in said second positioning and/or fixing connector or in said plurality of second positioning and/or fixing connectors.

13. A data processing program product, adapted for operating a measurement system for a device under test (DUT), said data processing program product comprising instructions which, when the program is executed by a data processing unit, cause the data processing unit to carry out the following program steps:

a first program step of reading first control data from a proximity sensor or from a plurality of proximity sensors;

a second program step of actuating an actuator or a plurality of actuators using electrical or electronical control commands to actuate an electrically or electronically actuated fixing arrangement or a plurality of electrically or electronically actuated fixing arrangements into a fixing status based on previously read first control data from a proximity sensor or from a plurality of proximity sensors;

a third program step of initiating an electrical connection and/or a data connection from a second positioning and/or fixing connector and/or from a test arrangement to a first positioning and/or fixing connector and/or to a DUT via an electrical connector or via a plurality of electrical connectors;

a fourth program step of indicating data representing the fixing status and/or data connection status of the fixing connectors to a user;

a fifth program step of starting a predefined test procedure for said DUT;

a sixth program step of reading second control data from a touch sensitive sensor;

a seventh program step of actuating an actuator or a plurality of actuators using electrical or electronical control commands to actuate an electrically or electronically actuated fixing arrangement or a plurality of electrically or electronically actuated fixing arrangements into a release status; and an eighth program step of indicating data representing the release status and/or data connection release status of the fixing connectors to a user.

* * * * *